(12) United States Patent
Ito

(10) Patent No.: US 6,603,303 B1
(45) Date of Patent: Aug. 5, 2003

(54) METHOD AND APPARATUS FOR TESTING INTEGRATED CIRCUIT

(75) Inventor: Kiyoshi Ito, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/576,618

(22) Filed: May 23, 2000

(30) Foreign Application Priority Data

May 31, 1999 (JP) .......................................... 11-153076

(51) Int. Cl.⁷ .......................... G01R 1/04; G01R 31/02
(52) U.S. Cl. .................................. 324/158.1; 324/754
(58) Field of Search ............................. 324/158.1, 754, 324/758; 209/573, 571, 574; 414/403, 416

(56) References Cited

U.S. PATENT DOCUMENTS

| | | | | |
|---|---|---|---|---|
| 4,768,195 A | * | 8/1988 | Stoner et al. | 324/73.1 |
| 5,235,271 A | * | 8/1993 | Kira | 324/73.1 |
| 5,541,862 A | * | 7/1996 | Bright et al. | 324/73.1 |
| 5,625,287 A | * | 4/1997 | Nakamura et al. | 324/158.1 |
| 5,740,183 A | * | 4/1998 | Lowe | 371/25.1 |
| 5,812,409 A | * | 9/1998 | Kanno et al. | 324/158.1 |
| 6,016,554 A | * | 1/2000 | Skrovan et al. | 714/25 |
| 6,055,463 A | * | 4/2000 | Cheong | 209/573 |
| 6,163,000 A | * | 12/2000 | Huang | 324/158.1 |
| 6,184,675 B1 | * | 2/2001 | Bannai | 324/158.1 |
| 6,195,776 B1 | * | 2/2001 | Ruiz et al. | 714/738 |
| 6,223,098 B1 | * | 4/2001 | Cheong et al. | 209/573 |
| 6,225,798 B1 | * | 5/2001 | Onishi et al. | 324/158.1 |
| 6,259,247 B1 | * | 7/2001 | Banni | 324/158.1 |

* cited by examiner

Primary Examiner—Kamand Cuneo
Assistant Examiner—Jermele Hollington
(74) Attorney, Agent, or Firm—Fish & Richardson P.C.

(57) ABSTRACT

An integrated circuit testing apparatus includes a control section 12 including a memory for storing the plurality of testing programs corresponding to the plurality of tests, and a transfer control unit for transferring the plurality of testing programs on the basis of an control command; and an IC testing section 20 including a ROM 24 in which the testing programs transferred from the transfer control means are stored, a RAM 26 in which the test results are temporarily stored, and a processing unit 22 for temporarily storing the test results in the RAM 26 whenever execution of each testing program has been completed, synthesizing all the test results when execution of all the testing programs have been completed to set a final test result for each device to be tested, and sending the final result to the automatic sorter 30.

4 Claims, 4 Drawing Sheets

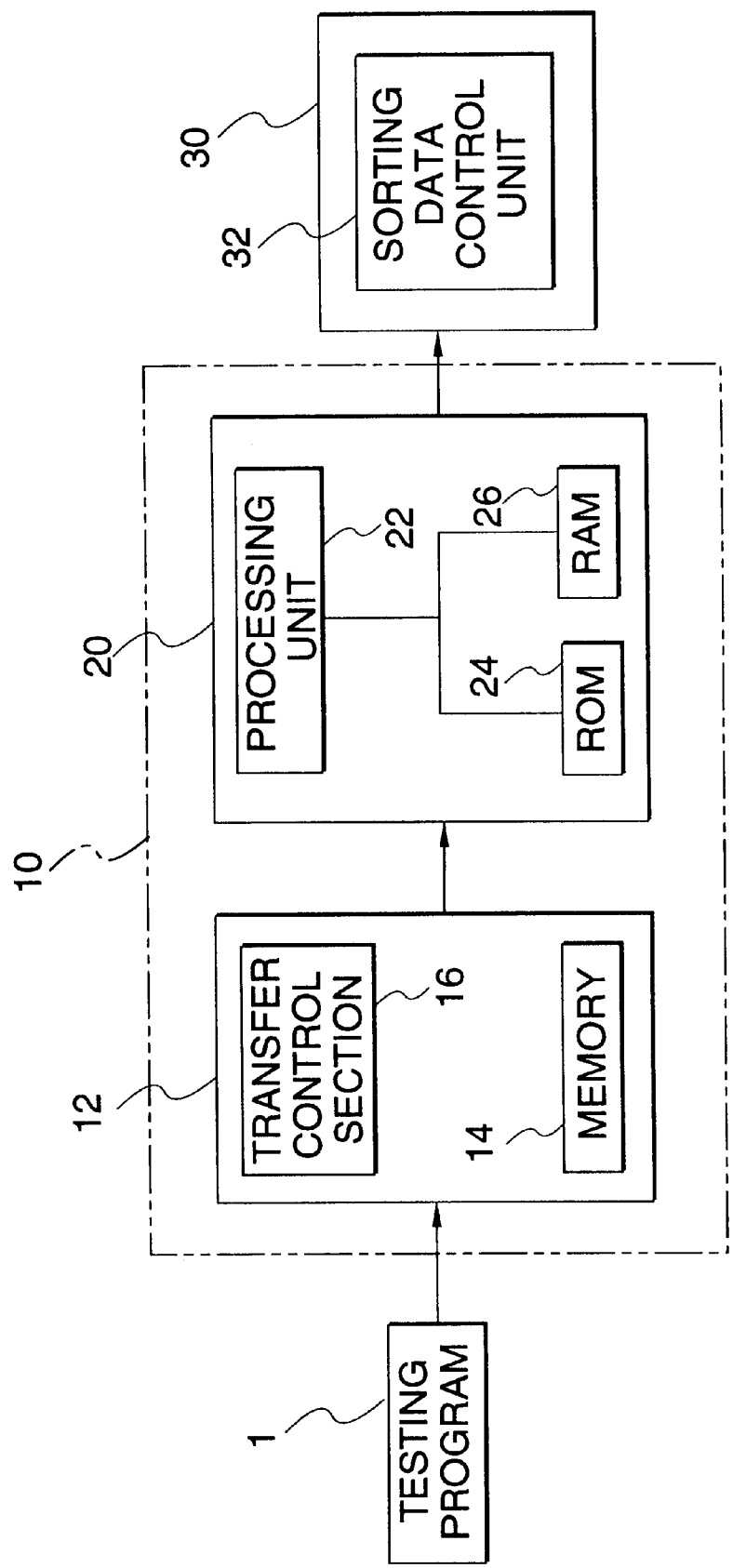

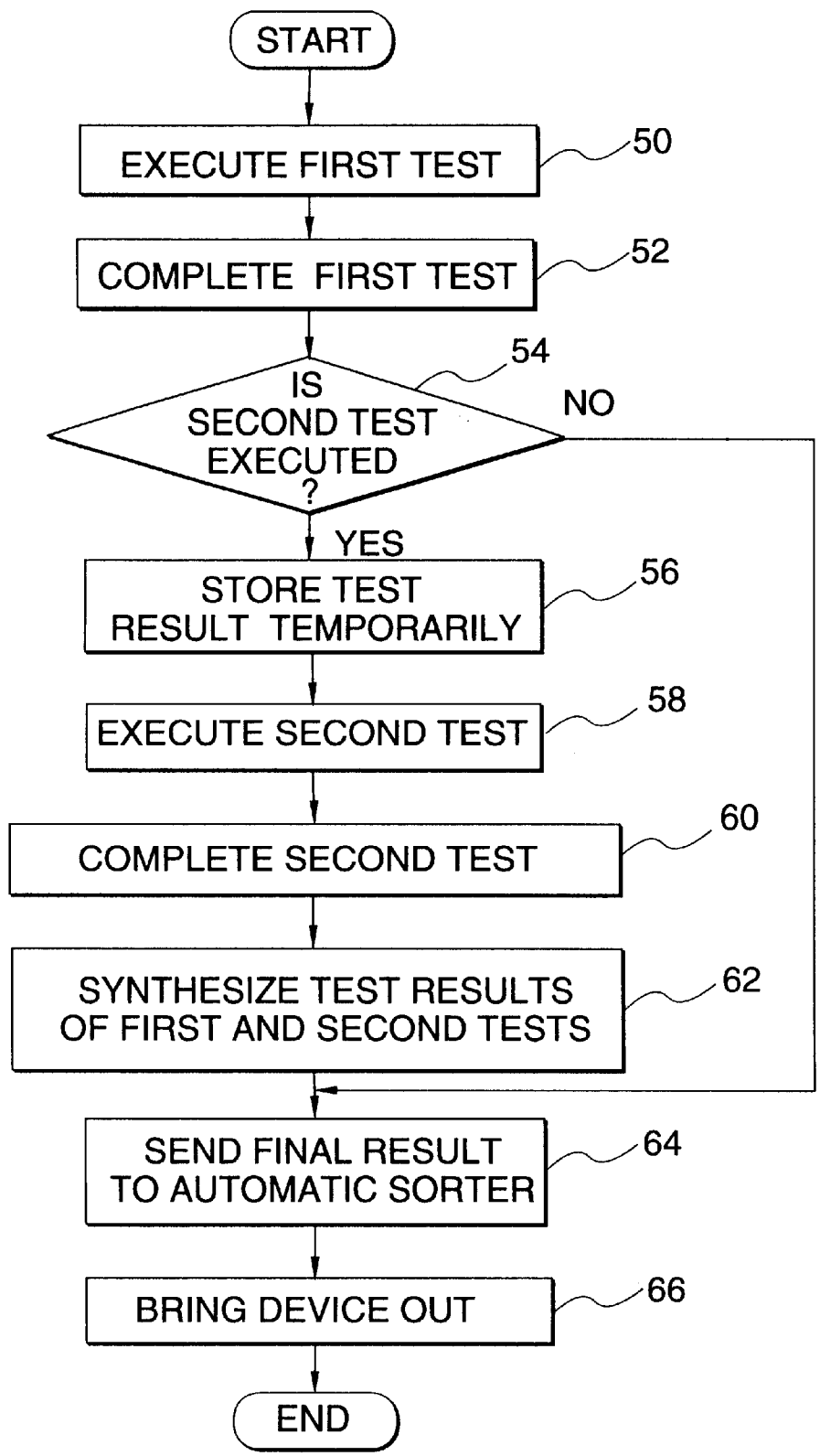

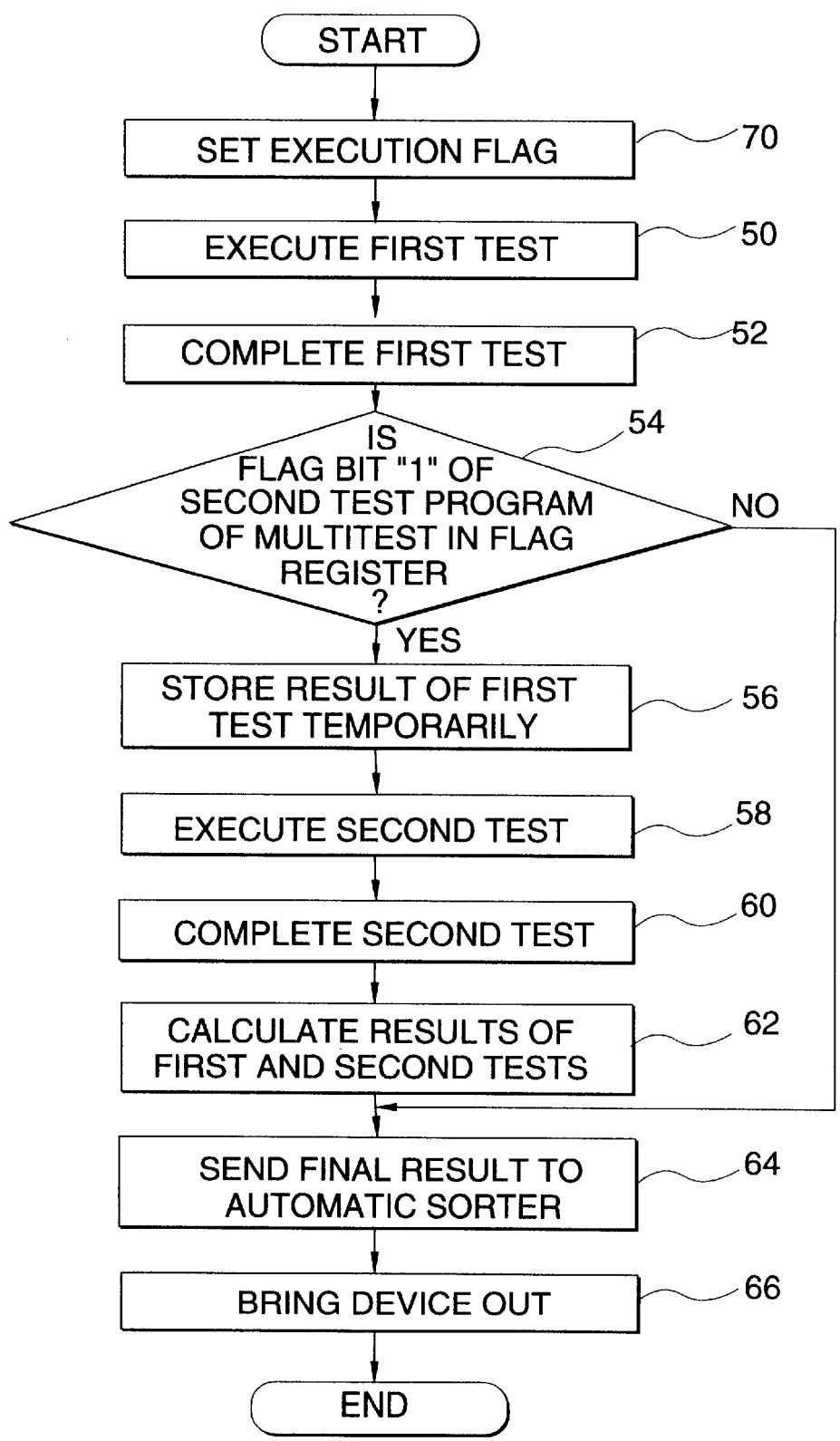

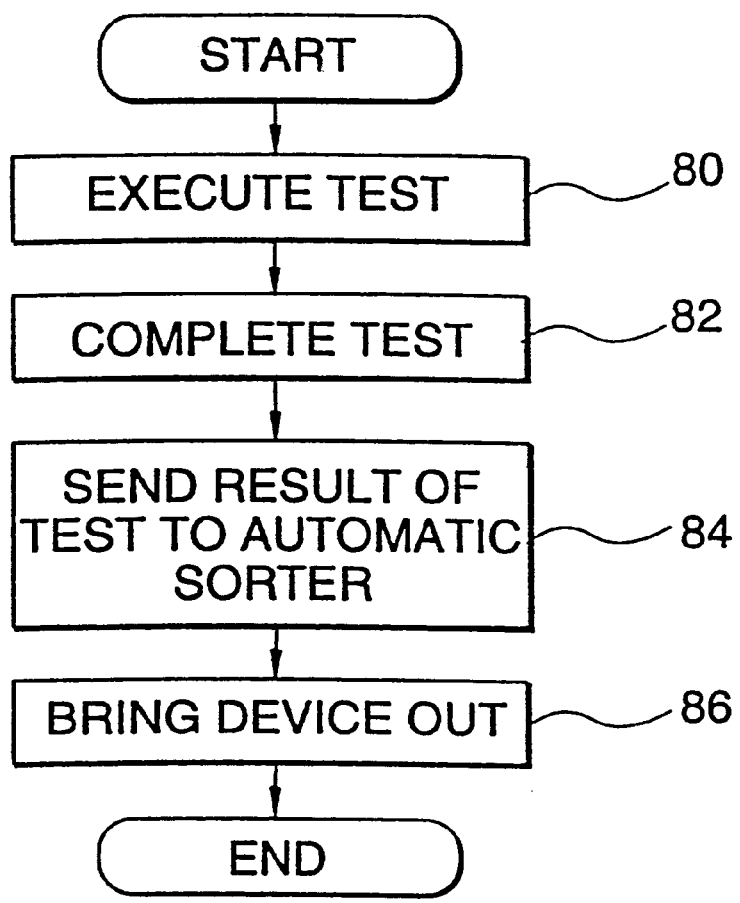

METHOD AND APPARATUS FOR TESTING INTEGRATED CIRCUIT

BACKGROUND OF THE INVENTION

1. Field of the Invention

The present invention relates to a method and apparatus for making a plurality of tests for the integrated circuit as a device-to-be-tested by executing a test program prepared corresponding to each test and producing a test result for each device-to-be-tested to an automatic selector for integrated circuits.

2. Description of the Related Art

Generally, in order to test an integrated circuit, a testing apparatus tests the integrated circuit under a testing condition set for the integrated circuit using a testing program. On the basis of the testing result, an automatic selector connected to the testing apparatus selects the integrated circuit.

Now referring to FIG. 4, an explanation will be given of a conventional integrated-circuit testing method. In step 80, a testing program is executed. In step 82, when the execution of the testing program is completed, the test result is set for each of devices to be tested. In step 84, the set test result for each device to be tested is sent to an automatic sorter. In step 86, the devices to be tested are brought out from the integrated-circuit testing apparatus and are moved to the automatic selector. The automatic selector classifies the devices to be tested on the basis of the test result (data) supplied from the integrated circuit apparatus in step 84 and store them.

However, in the above conventional IC testing method, the test is completed when a single test, i.e. a single testing program has been executed, and the test result is sent to the automatic selector. Therefore, in order to make plural tests, tests according to the plural programs must be executed individually.

SUMMARY OF THE INVENTION

In view of such a circumstance, the present invention has been accomplished, an object of the present invention is to provide an IC testing method and apparatus which can send a final test result to an automatic selector after a plurality of kinds of testing programs have been executed without bringing devices to be tested out of the test apparatus whenever each test has been completed.

According to a first aspect of the present invention, there is provided a method for testing integrated circuits which making a plurality of kinds of tests for the integrated circuits (ICs) which are devices-to-be-tested by executing a plurality of programs prepared corresponding to the plurality of kinds of tests to send test results for each device to an automatic sorter, is characterized by comprising the steps of temporarily storing the test results whenever execution of each testing program has been completed, synthesizing all the test results when execution of all the testing programs have been completed to set a final test result for each device to be tested, and sending the final result for each device to the automatic sorter.

Therefore, according to the first aspect of the present invention, a final test result can be sent to the automatic sorter after a plurality of kinds of testing programs have been executed without bringing out devices to be tested whenever each test has been completed.

According to a second aspect of the present invention, there is provided a method which a plurality of programs prepared corresponding to the plurality of kinds of tests are executed, and test results set for each device are sent to an automatic sorter, and the method is characterized by comprising the steps of: previously designating testing programs to be executed of the plurality of testing programs, temporarily storing the test results whenever execution of each designated testing program has been completed, synthesizing all the test results when execution of all the designated testing programs have been completed to set a final test result for each device to be tested, and sending the final result for each device to the automatic sorter.

Therefore, according to the second aspect of the present invention, a final test result can be sent to the automatic sorter after programs designated to be executed of the plurality of kinds of testing programs have been executed without bringing out devices to be tested whenever each test has been completed.

According to a third aspect of the present invention, there is provide an apparatus for testing integrated circuits which making a plurality of kinds of tests for the integrated circuits (ICs) which are devices-to-be-tested by executing a plurality of programs prepared corresponding to a plurality of kinds of tests to send test results for each device to an automatic sorter, the apparatus comprising: a control section including storage means for storing the plurality of testing programs corresponding to the plurality of tests, and transfer control means for transferring the plurality of testing programs on the basis of an control command; and an IC testing section including a first storage means in which the testing programs transferred from the transfer control means are stored, a second storage means in which the test results are temporarily stored, and a processing means for temporarily storing the test results in the second storage means whenever execution of each testing program has been completed, synthesizing all the test results when execution of all the testing programs have been completed to set a final test result for each device to be tested, and sending the final result for each device to the automatic sorter.

Therefore, according to a third aspect of the present invention, a final test result can be sent to the automatic sorter after a plurality of kinds of testing programs have been executed without bringing out devices to be tested whenever each test has been completed.

According to a fourth aspect of the present invention, there is provided an apparatus for testing integrated circuits which making a plurality of kinds of tests for the integrated circuits (ICs) which are devices-to-be-tested by executing a plurality of programs prepared corresponding to the plurality of kinds of tests to send test results for each device to an automatic sorter, the apparatus comprises a control section including storage means for storing the plurality of testing programs corresponding to the plurality of tests, and transfer control means for transferring the plurality of testing programs on the basis of an control command; and an IC testing section including a first storage means in which the testing programs transferred from the transfer control means are stored, a second storage means in which the test results are temporarily stored, and a processing means for executing the plurality of testing programs on the basis of evaluation of a flag previously set for each of the plurality of testing programs and indicative of whether or not each the testing programs should be executed, temporarily storing the test results in the second storage means whenever execution of each testing program has been completed, synthesizing all the test results when execution of all the testing programs have been completed to set a final test result for each device to be tested, and sending the final result for each device to the automatic sorter.

Therefore, according to the fourth aspect of the present invention, a final test result can be sent to the automatic sorter after programs designated to be executed of the plurality of kinds of testing programs have been executed without bringing out devices to be tested whenever each test has been completed.

BRIEF DESCRIPTION OF THE DRAWINGS

FIG. 1 is a block diagram showing an arrangement of an integrated circuit testing apparatus according to a mode of carrying out the invention.

FIG. 2 is a flowchart showing the processing contents of testing integrated circuits which are executed by a processing unit of the integrated circuit testing apparatus.

FIG. 3 is a flowchart showing the details of processing contents of testing integrated circuits which are executed by a processing unit of the integrated circuit testing apparatus shown in FIG. 2.

FIG. 4 is a flowchart showing the contents of a conventional integrated circuit testing apparatus.

DETAILED DESCRIPTION OF THE PRESENT INVENTION

Now referring to the drawings, the present invention will be described in detail for a mode of carrying the invention with reference to the accompanying drawings.

FIG. 1 shows an arrangement of an IC testing apparatus according to the mode of carrying out the invention. In FIG. 1, an IC testing apparatus 10 includes a control section 12 for making read and transfer of a testing program, and an IC testing section 20 for testing ICs which are devices to be tested by executing the testing program.

The control section 12 includes a memory 14 for storing a plurality of programs prepared corresponding to a plurality of kinds of tests, and a transfer control section 16 for carrying out the transfer control of a plurality of testing programs stored in the memory 14. The control section 12, the memory 14 and the transfer control section 16 correspond to a control section, storage means and transfer control means in the invention, respectively.

The IC testing section 20 includes an ROM 24 in which a testing program is loaded, an RAM 26 for temporarily holding a test result and a processing unit 22 for testing an IC as a device to be tested by executing the testing program. The processing unit 22 may be a CPU, interface, etc. The IC testing section 20, ROM 24, RAM 26 and processing unit 22 correspond to an IC testing section, first storage means, second storage means and processing means in the invention, respectively.

An automatic selector 30 is connected to an output terminal of the IC testing section 20. The automatic selector 30 has a sorting or screening data control unit 32 for storing a test result made by the IC testing section 20, i.e. screening data for ICs and making sorting processing for the ICs on the basis of the sorting data.

In the above configuration, the transfer control unit 16 in the control section 12 causes the memory to store a plurality of testing programs 1 prepared corresponding to a plurality of kinds of tests. On the basis of a control command, the transfer control unit 16 transfers the testing programs stored in the memory 14 to the IC testing section 20. The processing unit 22 loads the testing programs thus transferred into the ROM 24.

The processing unit 22 successively executes the plurality of testing program loaded in the ROM 24 and stores each of the test results in the RAM 26. Upon completion of the tests, the IC testing section 20 transfers the test result, i.e. sorting data to the automatic sorter 30.

The sorting data control unit 32 in the automatic sorter 30 stores the received sorting data in an internal memory and makes the sorting processing on the basis of the sorting data. Thus, the ICs, which are devices to be tested, sent from the IC testing apparatus to the automatic sorter are sorted.

FIG. 2 shows the contents of the IC testing processing which is to be carried out by the processing unit 22 of the IC testing section 20. In FIG. 2, for simplicity of explanation, although two kinds of testing programs are adopted, three or more testing programs can be adopted.

Referring to FIG. 2, an explanation will be given of the processing of the testing programs by the processing unit 22. As seen from FIG. 2, in step 50, a first step, i.e. first testing program is executed. In step 52, execution of the first testing program is completed.

In step 54, an execution flag indicative of whether or not a second test, i.e. second testing program should be executed is evaluated. If the execution flag has been set, the processing proceeds to step 56. If the execution flag has been reset, the processing proceeds to step 64. In the former case, in step 56, the test results of the first test is temporarily stored in the RAM 26. In step 58, a second test, i.e. second testing program is executed.

In step 60, execution of the second testing program is completed. In step 62, the test results of the first test and the second test are synthesized to set a final result for each device to be tested. In step 64, the test results (sorting data) are sent to the automatic sorter 30. In step 66, the ICs to be tested are brought out from the IC testing apparatus 10 to the automatic sorter 30. The automatic sorter 30 sorts the devices in the corresponding classes and houses a housing chamber.

FIG. 3 shows the details of the processing illustrated in FIG. 2. In order to avoid repetition of explanation, in FIG. 3, like reference numerals refer to like steps in FIG. 2. In FIG. 3, before the testing is started, in step 70, the execution flag indicative of whether or not the second test, i.e. second testing program should be executed is set from a console of the IC testing apparatus 10. For example, in a flag register called MULTITEST, the flag is set by writing "1" on the flag bit corresponding to each testing program.

In step 50, the first program (first test) is executed, and in step 52, its execution is completed. In step 54, the data of the flag bit in the flag resister MULTITEST set in previous step 70 is read. If the data of the flag bit is "1", the processing proceeds to step 56 in order execute the second testing program (second test). If the data of the flag bit is "0", the processing proceeds to step 64 since the second testing program is not executed. The operation of executing the second testing is the same as described in connection with FIG. 2.

As understood from the description hitherto made, the IC testing method and apparatus according to the mode for carrying out the invention, IC testing method and apparatus can send a final test result to an automatic sorter after a plurality of kinds of testing programs have been executed without bringing out devices to be tested whenever each test has been completed, thereby shortening the time required to transfer the device to be tested from the IC testing apparatus to the automatic sorter to provide an economic device testing environment.

Therefore, according to the present invention, the final test result can be sent to the automatic sorter after a plurality of kinds of testing programs have been executed without bringing out devices to be tested whenever each test has been completed.

What is claimed is:

1. A method for testing a plurality of integrated circuits, the method comprising the steps of:

executing a plurality of testing programs corresponding to a plurality of tests for each of the plurality of integrated circuits (ICs);

temporarily storing test results when the execution of each of the plurality of testing programs is completed;

synthesizing all of the test results after the executions of all of the testing programs are completed to set a final test result for each of the plurality of integrated circuits, and sending the final test result for each of the plurality of integrated circuits to an automatic sorter.

2. The method as claimed in claim 1, further comprising a step of previously selecting a plurality of testing programs to be executed from the plurality of testing programs, wherein the plurality of selected testing programs are executed in the executing step.

3. An apparatus for testing a plurality of integrated circuits for executing a plurality of tests by executing a plurality of programs corresponding thereto, the apparatus comprising:

an automatic sorter for storing a final test result;

a control section including:

storage means for storing the plurality of testing programs; and transfer control means for transferring the plurality of testing programs on the basis of a control command; and an IC testing section coupled to an output of the control section and to an input of the sorter, the IC testing section including:

a first storage means for storing the plurality of testing programs transferred from the transfer control means;

a second storage means for temporarily storing test results; and a processing means for executing the plurality of testing programs, temporarily storing the test results in the second storage means whenever the execution of each testing programs is completed, synthesizing all of the test results after the execution of all of the testing programs is completed to set a final test result for each of the plurality of integrated circuits, and sending the final result for each of the plurality of integrated circuits to the automatic sorter.

4. The apparatus as claimed in claim 3, wherein the processing means executes the plurality of testing programs on the basis of a flag previously set for each of the plurality of testing programs, the flag indicating whether or not each of the testing programs is to be executed.

* * * * *